(12) United States Patent
Cheng et al.

(10) Patent No.: US 7,887,356 B1
(45) Date of Patent: Feb. 15, 2011

(54) SOCKET CONNECTOR HAVING PROTURSIONS FOR POSITIONING IC PACKAGE

(75) Inventors: Andrew Cheng, Tu-Cheng (TW);
Hu-Guang Luo, Kunshan (CN);
Chia-Wei Fan, Tu-Cheng (TW);
Chih-Pi Cheng, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/730,265

(22) Filed: Mar. 24, 2010

(51) Int. Cl.
*H01R 13/62* (2006.01)
(52) U.S. Cl. ...................................................... 439/331
(58) Field of Classification Search .................. 439/331, 439/378, 525, 526, 70, 574, 575
See application file for complete search history.

(56) References Cited

U.S. PATENT DOCUMENTS

| 6,132,220 | A | * | 10/2000 | McHugh et al. ............... 439/66 |
| 6,164,980 | A | * | 12/2000 | Goodwin ....................... 439/70 |
| 6,908,316 | B2 | | 6/2005 | Ma et al. |
| 7,056,130 | B1 | | 6/2006 | McAlonis et al. |
| 7,361,028 | B1 | | 4/2008 | Polnyl |
| 7,371,098 | B2 | | 5/2008 | Wang et al. |
| 2008/0233788 | A1 | * | 9/2008 | Chang et al. ................. 439/331 |
| 2008/0304244 | A1 | * | 12/2008 | Hsieh .......................... 361/810 |
| 2009/0075499 | A1 | * | 3/2009 | Szu ............................... 439/68 |
| 2010/0159732 | A1 | * | 6/2010 | Yeh et al. ..................... 439/366 |

* cited by examiner

*Primary Examiner*—Chandrika Prasad
(74) *Attorney, Agent, or Firm*—Andrew C. Cheng; Wei Te Chung; Ming Chieh Chang

(57) ABSTRACT

A socket connector includes a socket body, a plurality of contact terminals received in the socket body. The socket body includes an upper surface, a plurality of sidewalls extending upwardly from the upper surface. The upper surface and the sidewalls jointly define a cavity for receiving an IC package therein. A plurality of protrusions extend upwardly from the upper surface and formed separately from the sidewall. The protrusions being discretely distributed at periphery of the IC package and thereby positioning the IC package.

13 Claims, 4 Drawing Sheets

SOCKET CONNECTOR HAVING PROTURSIONS FOR POSITIONING IC PACKAGE

BACKGROUND OF THE INVENTION

1. Field of the Invention

The present invention relates to a socket connector, and more particularly to a socket connector having improved datum blocks for accurately positioning an IC package and capable of preventing deformation of the protrusions.

2. Description of Related Art

Connectors are used for a number of applications. In one such application that occurs commonly in a computer system, a socket connector is provided to be mounted on a mother board for receiving an IC (Integrated Circuit) package. The socket connector generally comprises at least a socket body and an array of contact terminals mounted within the socket body. An IC package is placed onto the socket body and then brought into contact with the contact terminals in the socket body. The contact terminals are also electrically connected onto conductive pads disposed on the mother board, respectively, such that the electrical connection between the IC package and the circuit in the mother board is achieved. One of the problems encountered by the industry is the shrinkage of the plastic material during molding. The part intended for datum tends to deform because of deformation resulted from shrinkage.

U.S. Pat. No. 6,908,316 issued to Ma on Jun. 21, 2005 discloses a socket connector performing such a function as described above. Referring to FIGS. 1-5 of Ma, the socket connector includes an insulative socket body and a load plate pivotally coupled to one end of the socket body. The socket body has a cavity for receiving and securing IC package. To ensure a fine and true positioning of the IC package, a plurality of protrusions are provided on the sidewalls to extend inwardly from inner surfaces of peripheral sidewalls of the cavity. The IC package is constrained by the protrusions when placed in the cavity, such that precise alignment between the IC package and the contact terminals in the socket body is ensured. A soldering process in a high temperature environment is necessary to mount the socket connector onto a mother board. However, the accuracy of the protrusions that integrally formed with the sidewalls is like to be influenced by the deformation of the sidewalls that caused due to the high-temperature environment, such that the precise positioning of the IC package could not be guaranteed.

U.S. Pat. No. 7,056,130 issued to McAlonis et al. on Jun. 6, 2006 discloses a socket connector that includes an insulative socket body for receiving an IC package. Referring to FIG. 2 and FIG. 3, the insulative socket body has sidewalls distributed at corners thereof, respectively. Each side wall is integrally formed with a protrusion 192 that used to position the IC package. An improvement in McAlonis is made that the sidewalls are noncontinuous with each other and are relatively short in length. Therefore, the influence to the accuracy of the protrusion that caused by the deformation of the sidewalls is relatively small. However, the defect still exists in such a design.

SUMMARY OF THE INVENTION

Accordingly, an object of the present invention is to provide a socket connector with improved datum ensuring true position of the contact terminals and conductive pads under the IC package.

According to one aspect of the present invention, there is provided a socket connector which includes a socket body, a plurality of contact terminals received in the socket body. The socket body includes an upper surface, a plurality of sidewalls extending upwardly from the upper surface. The upper surface and the sidewalls jointly define a cavity for receiving an IC package therein. A plurality of protrusions extend upwardly from the upper surface and formed separately from the sidewall. The protrusions are discretely distributed at periphery of the IC package and thereby positioning the IC package.

According to another aspect of the present invention, there is provided a socket connector for receiving an IC package therein. The socket connector includes a socket body and a plurality of contact terminals received in the socket body. The socket body includes an upper surface and a plurality of sidewalls extending upwardly from the upper surface. The upper surface and the sidewalls jointly defining a cavity for the IC package. A protrusion is provided in the cavity for positioning the IC package and is physically away from the sidewalls, thereby substantially remaining intact and undeformed while the sidewalls are deflected when enduring a high temperature environment.

Other objects, advantages and novel features of the invention will become more apparent from the following detailed description when taken in conjunction with the accompanying drawings, in which:

DETAILED DESCRIPTION OF THE INVENTION

Reference will now be made to the drawings to describe the present invention in detail.

Figure 1:
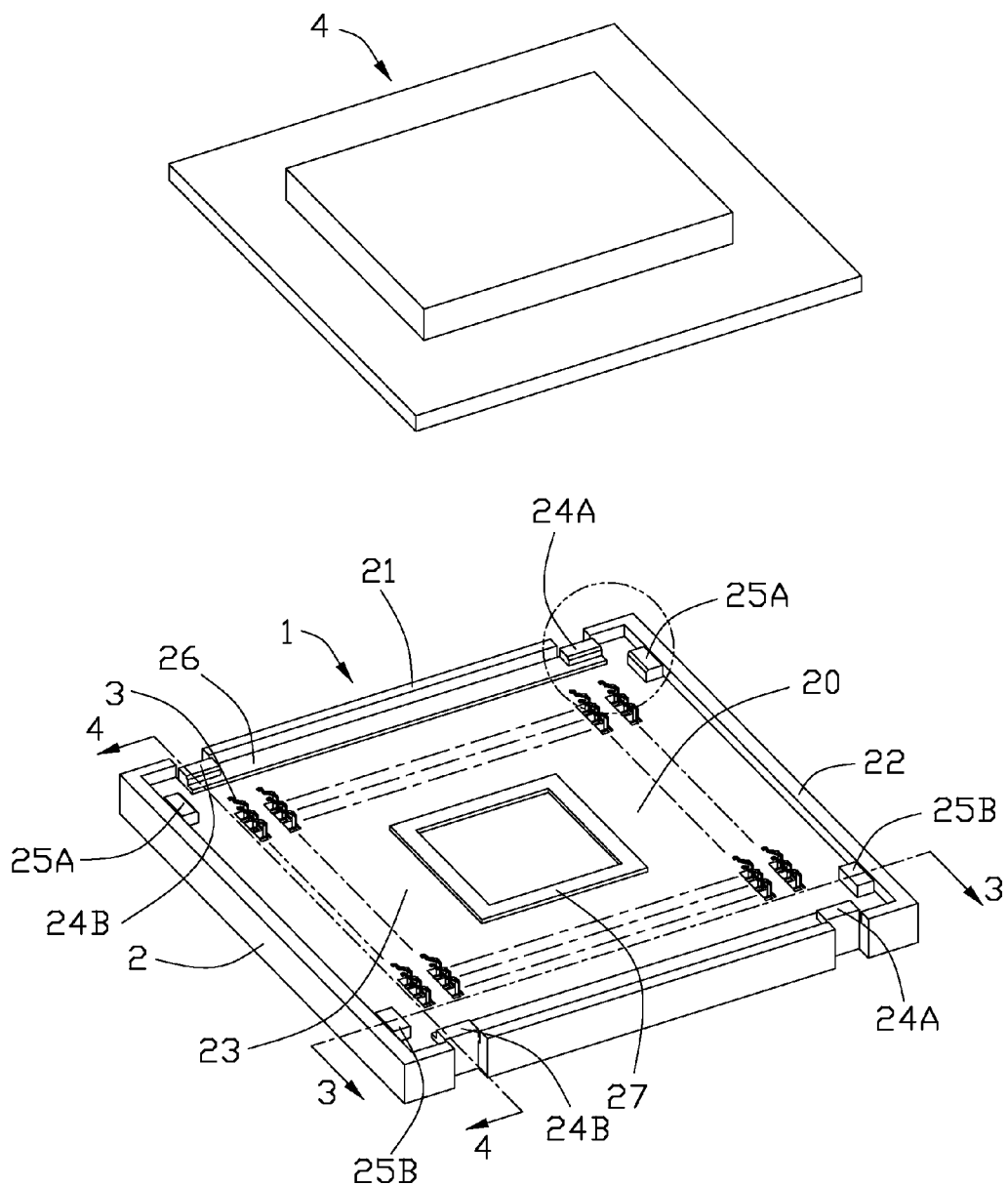
FIG. 1 is a perspective view of a socket connector in accordance with a preferred embodiment of the present invention, and an IC package to be mounted into the socket connector.

FIG. 1 illustrates a socket connector 1 made in accordance to a preferred embodiment of the present invention, which is generally used to be mounted onto a mother board (not shown) for receiving an IC package 4. The socket connector 1 includes an insulative socket body 2, and a plurality of contact terminals 3 received in the socket body 2. The socket body 2 includes an upper surface 20 and four sidewalls 21, 22 surrounding the upper surface 20. The sidewalls 21, 22 are configured with different features and are grouped to a pair of opposite first sidewalls 21 and a pair of opposite second sidewalls 22. The upper surface 20 and sidewalls 21, 22 jointly define a cavity 23 for receiving the IC package 4.

Figure 2:
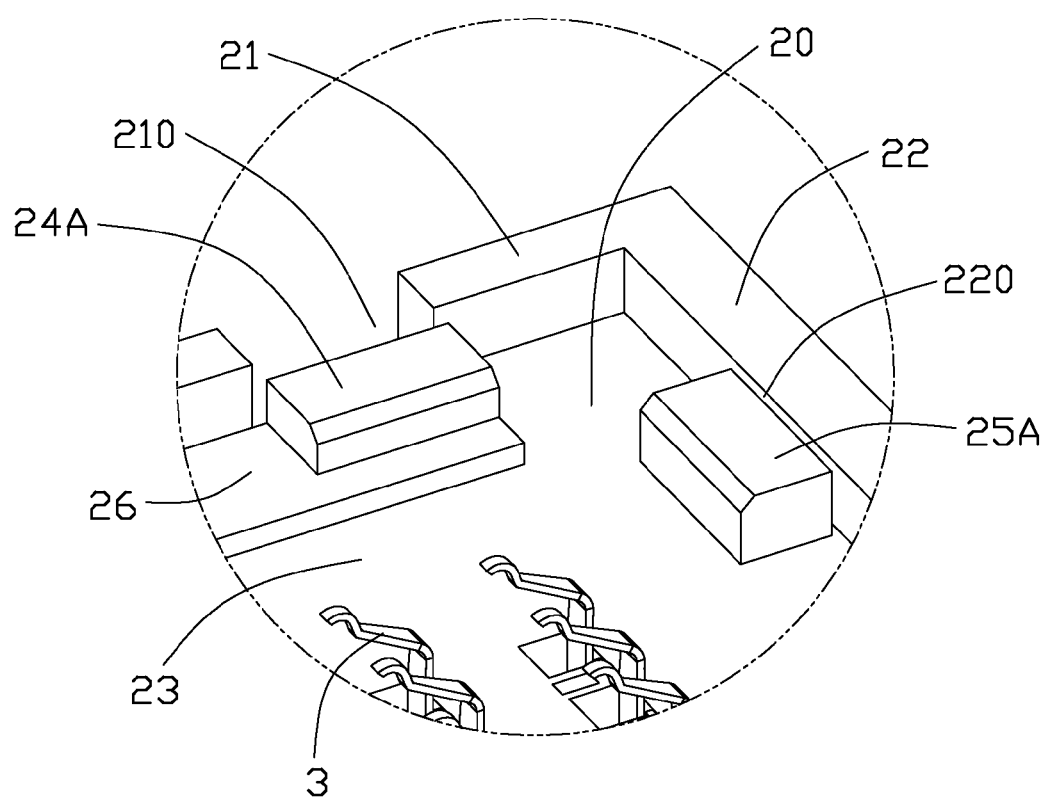
FIG. 2 is an enlarged view of the labeled area in circle-line in FIG. 1.
Figure 3:
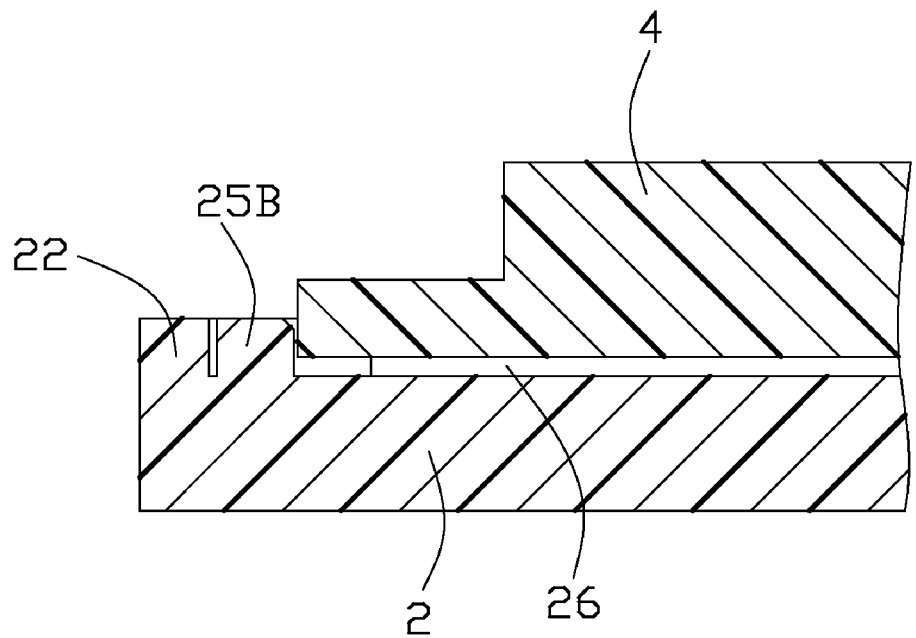
FIG. 3 is sectional view of the socket connector, taken along the line 3-3 in FIG. 1, with an IC package received therein.
Figure 4:
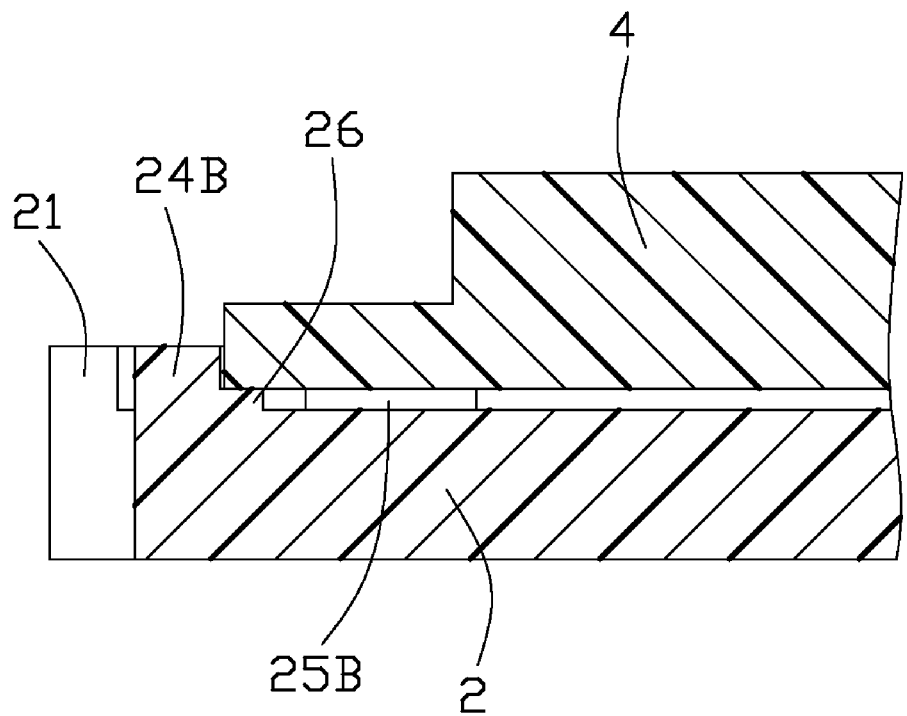
FIG. 4 is sectional view of the socket connector, taken along the line 4-4 in FIG. 1, with an IC package received therein.

Particularly referring to FIGS. 2-4, each sidewall 21, 22 is configured to be associated with two protrusions 24A, 24B, 25A, 25B. Respectively, the first sidewall 21 is corresponding to the first protrusions 24A, 24B, and the second sidewall 22 is corresponding to the second protrusions 25A, 25B. These protrusions 24A, 24B, 25A, 25B are discretely distributed to meet the periphery of the IC package 4 and thereby correctly positioning the IC package 4 within the socket connector 1. The first and second protrusions 24A, 24B, 25A, 25B extend upwardly from the upper surface 20, and are formed separately from corresponding sidewalls 21, 22. The first sidewall 21 is discontinuously formed and defines a pair of notches 210 behind corresponding protrusions 24A, 24B, while the second sidewall 22 is continuously formed, such that a gap 220 is defined between the side wall 22 and corresponding protrusion 25A, 25B.

The upper surface 20 has a first seating plane 26 extending upwardly therefrom for supporting the IC package 4. The first seating plane 26 is formed integrally with the first protrusions 24A, 24B and has a lower height than that of the first protrusion 24A, 24B. In addition, the upper surface 20 further has a second seating plane 27 extending upwardly therefrom for together supporting the IC package 4. The second seating plane 27 is located at a substantial middle position of the upper surface 20 and is coplanar with the first seating plane 26.

The preferred embodiment of the present invention as described above utilizes individual protrusions that separate from the sidewalls of the socket body to position an IC package. The protrusions directly extend from an upper surface of the socket body and are physically away from the sidewall. Therefore, the protrusion is not likely to be directly affected by the deformation of the sidewall, thereby remaining intact and undeformed while the sidewalls are deflected or deformed when enduring a high temperature environment.

While preferred embodiments in accordance with the present invention has been shown and described, equivalent modifications and changes known to persons skilled in the art according to the spirit of the present invention are considered within the scope of the present invention as defined in the appended claims.

What is claimed is:

1. A socket connector, comprising:
    a socket body comprising an upper surface, a plurality of sidewalls extending upwardly from the upper surface, the upper surface and the sidewalls jointly defining a cavity for receiving an IC package therein;
    a plurality of contact terminals received in the socket body; and
    a plurality of protrusions extending upwardly from the upper surface and formed separately from the sidewall, the protrusions being discretely distributed at periphery of the IC package and thereby positioning the IC package.

2. The socket connector as claimed in claim 1, wherein socket body is configured with a rectangular shape with four said sidewalls surrounding the upper surface, each sidewall being configured to be corresponding to at least one of said protrusions.

3. The socket connector as claimed in claim 2, wherein at least one sidewall is continuously formed, such that a gap is defined between the side wall and corresponding protrusion.

4. The socket connector as claimed in claim 2, wherein at least one sidewall is discontinuously formed and defines a notch behind corresponding protrusion.

5. The socket connector as claimed in claim 1, wherein the upper surface has a first seating plane extending upwardly therefrom for supporting the IC package, the first seating plane being formed integrally with at least one of the protrusions and having a lower height than that of the protrusion.

6. The socket connector as claimed in claim 5, wherein the upper surface has a second seating plane extending upwardly therefrom for supporting the IC package, the second seating plane being located at a substantial middle position of the upper surface and being coplanar with the first seating plane.

7. A socket connector for receiving an IC package therein, comprising:
    a socket body comprising an upper surface and a plurality of sidewalls extending upwardly from the upper surface, the upper surface and the sidewalls jointly defining a cavity for the IC package;
    a plurality of contact terminals received in the socket body; and
    a protrusion provided in the cavity for positioning the IC package, the protrusion being physically away from the sidewalls, thereby substantially remaining intact and undeformed when the sidewalls are deflected due to a high temperature environment.

8. The socket connector as claimed in claim 7, wherein the protrusion extends upwardly from the upper surface of the socket body.

9. The socket connector as claimed in claim 8, wherein socket body has a rectangular shape with four said sidewall surrounding the upper surface, each sidewall being configured to be corresponding to at least one said protrusion.

10. The socket connector as claimed in claim 9, wherein at least one sidewall is continuously formed such that a gap is defined between the side wall and corresponding protrusion.

11. The socket connector as claimed in claim 9, wherein at least one sidewall is discontinuously formed and defines a notch behind corresponding protrusion.

12. The socket connector as claimed in claim 7, wherein the upper surface has a first seating plane extending upwardly therefrom for supporting the IC package, the seating plane being formed integrally with the protrusion and having a lower height than that of the protrusion.

13. The socket connector as claimed in claim 12, wherein the upper surface has a second seating plane extending upwardly therefrom for supporting the IC package, the seating plane being located at a substantial middle position of the upper surface and being coplanar with the first seating plane.

* * * * *